United States Patent
Sokol

(10) Patent No.: US 6,384,368 B1
(45) Date of Patent: May 7, 2002

(54) LASER AMPLIFIER WITH VARIABLE AND MATCHED WAVELENGTH PUMPING

(75) Inventor: David Sokol, Dublin, OH (US)

(73) Assignee: LSP Technologies, Inc., Dublin, OH (US)

( * ) Notice: Subject to any disclaimer, the term of this patent is extended or adjusted under 35 U.S.C. 154(b) by 0 days.

(21) Appl. No.: 09/305,526

(22) Filed: May 5, 1999

(51) Int. Cl.⁷ .......................... B23K 26/18; H01S 3/091
(52) U.S. Cl. .......................... 219/121.61; 219/121.85; 372/69; 372/70
(58) Field of Search ........................ 219/121.85, 121.61, 219/121.62, 121.64; 372/34, 39, 69, 70, 75

(56) References Cited

U.S. PATENT DOCUMENTS

| | | | |
|---|---|---|---|
| 5,022,041 A | * | 6/1991 | Jacobs |
| 5,127,019 A | * | 6/1992 | Epstein et al. |
| 5,285,467 A | * | 2/1994 | Scheps |
| 5,383,197 A | * | 1/1995 | Millar et al. |
| 5,426,656 A | * | 6/1995 | Tohmon et al. |
| 5,535,232 A | * | 7/1996 | Bowman et al. |
| 5,892,783 A | * | 4/1999 | Holsinger |
| 6,028,873 A | * | 2/2000 | Yamamoto et al. |
| 6,064,035 A | * | 5/2000 | Toller et al. |
| 6,205,164 B1 | * | 3/2001 | Ohishi et al. |
| 6,208,458 B1 | * | 3/2001 | Galvanauskas et al. |

OTHER PUBLICATIONS

*Applied Optics*, vol. 28, No. 12, Apr. 20, 1990. pp. 1765–1771. "Average Power Limits of Diode–Laser–Pumped Solid State Lasers" Santanu Basu and Robert L. Byer.

* cited by examiner

*Primary Examiner*—Tom Dunn
*Assistant Examiner*—Kiley Stoner
(74) *Attorney, Agent, or Firm*—Randall J. Knuth

(57) ABSTRACT

A laser amplifier for laser shock processing having a pump cavity supplying photons at selected or variable wavelengths and orientations to that of the gain medium present therein. In one embodiment, the pump wavelength is substantially equal to a corresponding wavelength difference between the upper laser state energy level and the ground state energy level of atoms composing the gain medium. In an alternate embodiment, photonic energy is applied asymmetrically to the gain medium to produce a desired spatial energy profile. The pump cavity may comprise an alexandrite laser or a diode laser system. Depending on the type of pump cavity, the photonic energy is applied to the gain medium either longitudinally or transverse to the laser beam axis of traversing therein.

22 Claims, 3 Drawing Sheets

LASER AMPLIFIER WITH VARIABLE AND MATCHED WAVELENGTH PUMPING

BACKGROUND OF THE INVENTION

1. Field of the Invention

The present invention relates to laser amplifiers, and in particular, a laser amplifier with variable and matched wavelength pumping of the gain medium disposed in a laser used for laser shock processing.

2. Description of the Related Art

Laser shock processing involves directing a pulse of coherent energy to a piece of solid material to produce shockwaves therein. The produced shockwave causes compressive residual stresses to form within the solid material. These compressive residual stresses improve the fatigue hardness and corrosion resistance properties of the solid material.

The gain medium is composed of atoms having various energy levels. When the gain medium is pumped with optical energy, electrons from the atoms of the gain medium are excited from a ground energy state to excited energy states. This difference is called the pump wavelength. The energy difference between the ground and upper laser state is called the transition wavelength. The energy difference between an excited energy state and the upper laser state is called the quantum defect. Heat in the form of photons is emitted when electrons make a transition from an excited energy state to the upper laser state. The quantum defect results in heat generated in the gain medium. The heat produces thermal lensing and stress birefrigerence that degrades the spatial and polarization properties of the laser beam and limits the repetition ratio of the laser.

Laser shock processing utilizes a laser composed of an oscillator, amplifiers, and lenses. The amplifier contains a pump cavity with gain medium which may have the geometry of a rod, slab or other shape. The pump cavity energizes the gain medium which, in turn, produces photons. The photons are incorporated into a beam of coherent energy which traverses the gain medium.

Typically, in laser shock processing, a flashlamp is used to pump the gain medium with photons. Flashlamp pumping delivers a broad spectrum of wavelengths to the gain medium. The flashlamp energy is at wavelengths longer and shorter than the transition wavelength between the upper and ground laser states of the gain medium.

When the gain medium is pumped with photons at wavelengths shorter than the transition wavelength, the electrons of the gain medium are excited to higher energy states above the upper laser state. Consequently, a quantum defect is created between the higher energy state and the upper laser state. The relaxation of the electron from the higher energy state to the upper laser state does not produce stimulated emission. Rather, the transition from the higher energy level to the upper laser energy state results in the generation of heat. The larger the gap in energy levels, the greater the amount of heat generated. The added heat leads to thermal loading of the gain medium. Due to the laser beam energy required for laser shock processing, the amount of thermal load is substantial. Consequently, lasers traditionally used in laser shock processing include a cooling system to remove heat from the gain medium.

One disadvantage of current lasers used for laser shock processing is the pumping of the gain medium of an amplifier with photons at a wavelength shorter than the transition wavelength of the gain medium. The shorter wavelength excites gain medium electrons into higher energy states above the upper laser state. Consequently, a quantum defect exists between the two energy states. The heat generated by this energy gap produces thermal strains in the gain medium and modification of the index of refraction. For example, stress in the gain medium could result in birefringence that distorts the laser beam.

A second disadvantage of pumping the gain medium with optical energy having a photon wavelength shorter than that of the transition wavelength is the inefficient use of energy. Stimulated emission (i.e. usable photonic energy) is not produced when the gain medium electron relaxes from the higher energy states to the upper laser energy state.

Yet another disadvantage in the art of laser shock processing is a limit on the repetition rate of a laser used in laser shock processing. Due to the excessive thermal loading on the gain medium, the rate of firing of the laser is limited in order to prevent potential damage to the gain medium. A reduced firing rate provides time for heat to dissipate from the gain medium.

What is needed in the art is a laser for laser shock processing in which the laser beam amplifier is pumped with photons at a wavelength which is substantially equal to the transition wavelength of the gain medium.

What is also needed in the art of laser shock processing is a laser amplifier which is pumped in orientations that optimize the spatial profile of the laser beam for laser shock processing.

SUMMARY OF THE INVENTION

The present invention provides an apparatus for laser shock processing using a laser having an amplifier which incorporates pumping the gain medium with photons at a predetermined wavelength. By controlling the applied photon wavelength, the present apparatus minimizes the quantum defect. In addition, varying the photon wavelength and the orientation at which the photonic energy is coupled to the gain medium, the present invention can modify the spatial energy profile of the resulting laser beam.

The present invention, in one embodiment thereof, is a laser shock processing apparatus for improving properties of a workpiece by providing shock waves therein. The laser shock processing apparatus includes an energy absorbing overlay which is applied to the workpiece. The amplifier has gain medium composed of atoms having a ground state, an upper laser state, and higher energy states. A transition state energy difference is the difference in energy level between the upper laser state and the ground state. The transition state energy difference corresponds to a transition wavelength. The amplifier has an axis along which the laser beam proceeds. Pumping means is operatively coupled to the gain medium for supplying photons at a predetermined pump wavelength which minimizes the quantum defect. In a further embodiment, the pumping means includes an alexandrite laser. In an alternate embodiment, the pumping means includes a diode laser pump. In a further embodiment, there is means to adjust the diode wavelength to a desired wavelength.

The present invention, in another embodiment thereof, is a laser shock processing apparatus for improving properties of a workpiece by providing shock waves therein. The laser shock processing apparatus includes an energy absorbing overlay applied to the workpiece. A laser beam has a laser beam wavelength and spatial energy profile. An amplifier has gain medium with an axis along which the laser beam proceeds. Pumping means is operatively coupled to the gain medium for supplying photons at a predetermined pump wavelength, whereby the pumping means modifies the laser beam spatial energy profile to a desired energy profile.

The present invention, in another embodiment thereof, is a laser shock processing apparatus for improving properties of a workpiece by providing shock waves therein. The laser shock processing apparatus includes an energy absorbing overlay applied to a workpiece. An amplifier has gain medium composed of atoms having energy states. These energy states include a ground energy state, a lower laser energy state, an upper laser energy state and higher energy states. Pumping means is operatively coupled to the gain medium for supplying photons at a predetermined pump wavelength, which excites the gain medium to an excited energy state. The excited energy state is such that a difference between the excited energy state and the upper laser state is minimized.

The present invention, in another embodiment thereof, is a laser shock processing apparatus for improving properties of a workpiece by providing shock waves therein. The laser shock processing apparatus includes an energy-absorbing overlay which is applied to the workpiece. A laser beam is applied to the overlay. An amplifier has gain medium with atoms having a ground energy state and an upper laser state from which stimulated emission takes place. A diode-pumping laser is operatably coupled to the gain medium for exciting the gain medium atoms from the ground state to the upper laser state.

One advantage of the present invention is a laser amplifier which pumps the gain medium with photons at a predetermined pump wavelength which minimizes the quantum defect. By decreasing or minimizing the wavelength difference between the pump wavelength and the transition difference wavelength, thermal load on the gain medium is reduced. Consequently, undesirable thermal focusing effects are reduced or eliminated. For example, increasing the wavelength of the pumped photons to the wavelength of the transition wavelength decreases thermal stress within the gain medium which could lead to birefringence effects in the laser beam. Additionally, reduction in thermal load on the gain medium reduces possible damage to the gain medium generated when the pump wavelength is shorter than that of the transition wavelength of the gain medium.

A second advantage of the present invention is more efficient use of energy. Pumping the gain medium with photons at wavelengths near the transition wavelength allows for more efficient coupling of the pump energy to the laser beam. When the photon wavelength is shorter than the transition wavelength, the gain medium electrons are excited to higher energy levels above the upper laser state. The energy difference between the higher energy states and the upper laser state results in energy being dissipated in the form of heat. As a result, energy is wasted rather than being applied to the energy of the laser beam. Consequently, a portion of the photon's energy is never realized as useful laser beam energy in laser shock processing.

However, pumping with photons at wavelengths substantially equal to the transition wavelength excites the gain medium directly to the upper laser state. As a result, photon energy applied to the gain medium results in a usable output laser beam when the electrons relax down to the lower laser state. Energy, in the form of heat, is significantly reduced.

Another advantage of the present invention is an apparatus with an amplifier pumped with photons which are coupled to the gain medium at a specific orientation to the laser beam in order to modify the laser beam spatial energy profile. The gain medium is pumped with photons at a predetermined axis relative to the laser beam transversing the gain medium. By varying the photon coupling orientation to the axis of the laser beam (e.g. transverse or longitudinal pumping), and supplying photons non-symmetrically to the gain medium, the present invention modifies the spatial energy profile of the resulting laser beam.

Yet another advantage of the present invention is an increase in useful life of a diode laser pump as compared with the life of a flashlamp. The average life of a flashlamp is on the order of approximately $10^6$ to $10^7$ laser processing cycles. The average life of a diode used in a diode laser pump is on the order of $10^9$ laser processing cycles. Therefore, there is a 100 to 1000 fold increase in laser processing cycles realized a diode laser pump over traditional flashlamp pumping.

BRIEF DESCRIPTION OF THE DRAWINGS

The above-mentioned and other features and advantages of this invention, and the manner of attaining them, will become more apparent and the invention will be better understood by reference to the following description of an embodiment of the invention taken in conjunction with the accompanying drawings, wherein.

Corresponding reference characters indicate corresponding parts throughout the several views. The exemplification set out herein illustrates one preferred embodiment of the invention, in one form, and such exemplification is not to be construed as limiting the scope of the invention in any manner.

DETAILED DESCRIPTION OF THE INVENTION

The improvements in fatigue life produced by laser shock processing are the result of deep residual compressive stresses developed in the irradiated surface that retard fatigue crack initiation and/or slow crack propagation. Changes in the shape of a crack front or slowing of the crack growth rate when the crack front encounters the laser shocked zone have been previously shown. Laser shock processing is an effective method for increasing fatigue life in metals by treating fatigue critical regions. For a more thorough background and the prior history of laser shock processing and high powered laser processing of engineered material, reference can be made to U.S. Pat. No. 5,131,957. The laser of U.S. Pat. No. 5,131,957 contains an amplifier which utilizes flashlamps to produce a laser beam for use in laser shock processing.

Another type of laser adaptable for use with laser shock processing is that of a Nd-glass laser manufactured by LSP Technologies, Inc. of Dublin, Ohio. The Nd-glass laser contains amplifier gain medium composed of Neodymium. Neodymium has various energy states which include a ground state, a lower laser state, an upper laser state, and additional higher excited energy states.(See FIG. 1a) The upper laser state is the $^4F_{3/2}$ energy level, which is about 800 nanometers (Eu=1.55 ev) above the ground state.

The difference between the upper laser state and the ground state is the transition state energy difference which corresponds to a transition wavelength. Traditional flashlamp pumping supplies photons at a substantially higher energy level (shorter wavelength) than the transition wavelength. Flashlamps pump the gain medium to energy states higher than the upper laser states (Eu=1.2 ev) above the lower laser state. The lower laser state is the $^4I_{11/2}$ energy state. The energy difference between the higher excited energy state and the upper laser state results in the production of heat as electrons non-radiatively relax down to the $^4F_{3/2}$ upper laser level. The production of heat results in a thermal load applied to the gain medium.

Figure 1:
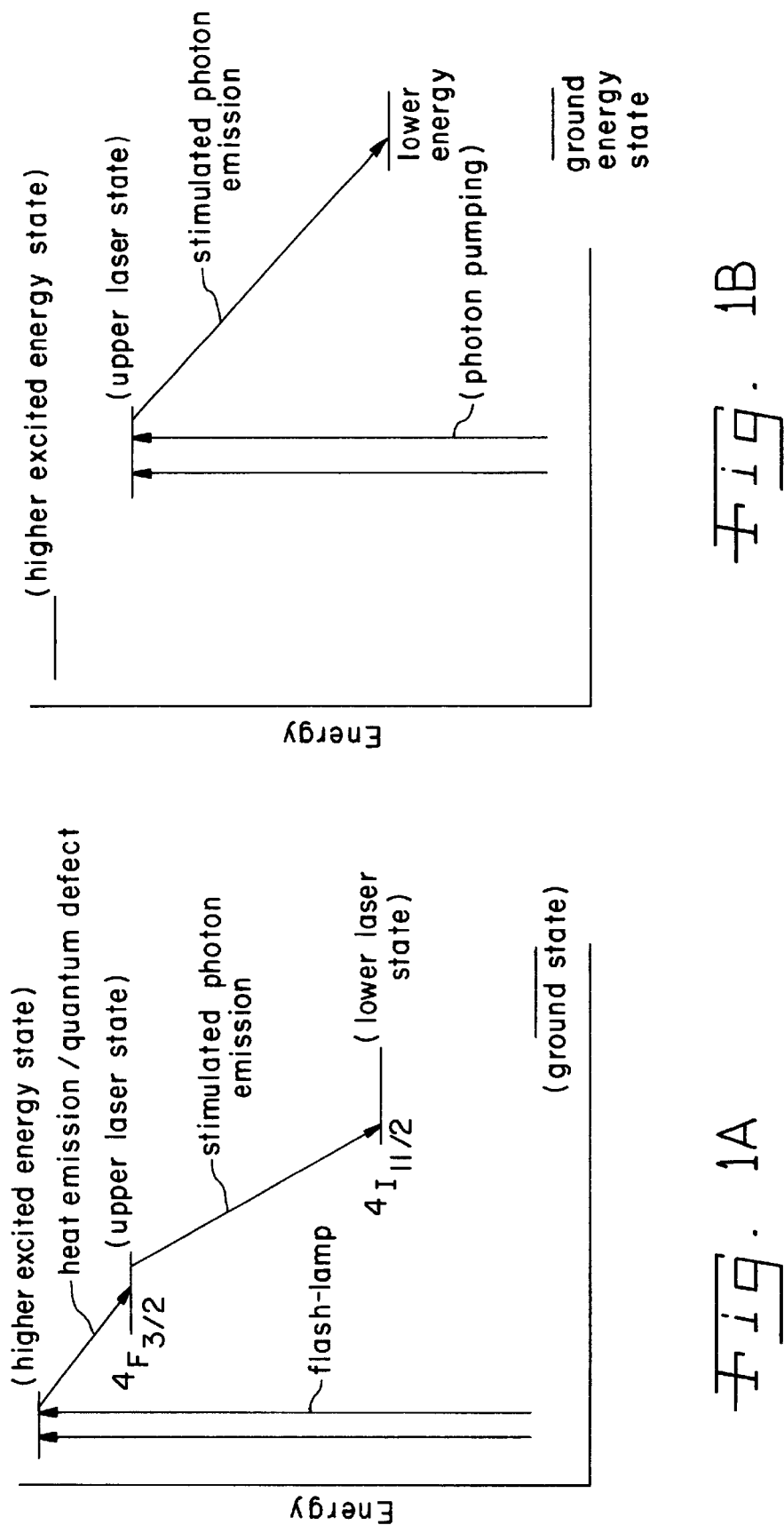
FIG. 1a is an energy level diagram showing the population inversion between the upper laser state and the ground state of gain medium pumped with flashlamps.
FIG. 1b is an energy level diagram showing the population inversion between the upper laser state and the ground state of gain medium pumped using a pump cavity of the present invention.

Referring to FIG. 1b, the present invention pumps the gain medium with photons having a wavelength which results in the excitation of the gain medium atoms to the upper laser state. Since photon pumping does not excite the gain medium to the higher excited energy states, heat emission is reduced. The gain medium electrons are not relaxing from a higher excited energy state to the upper laser state as is the case with flashlamp pumping.

Figure 2:
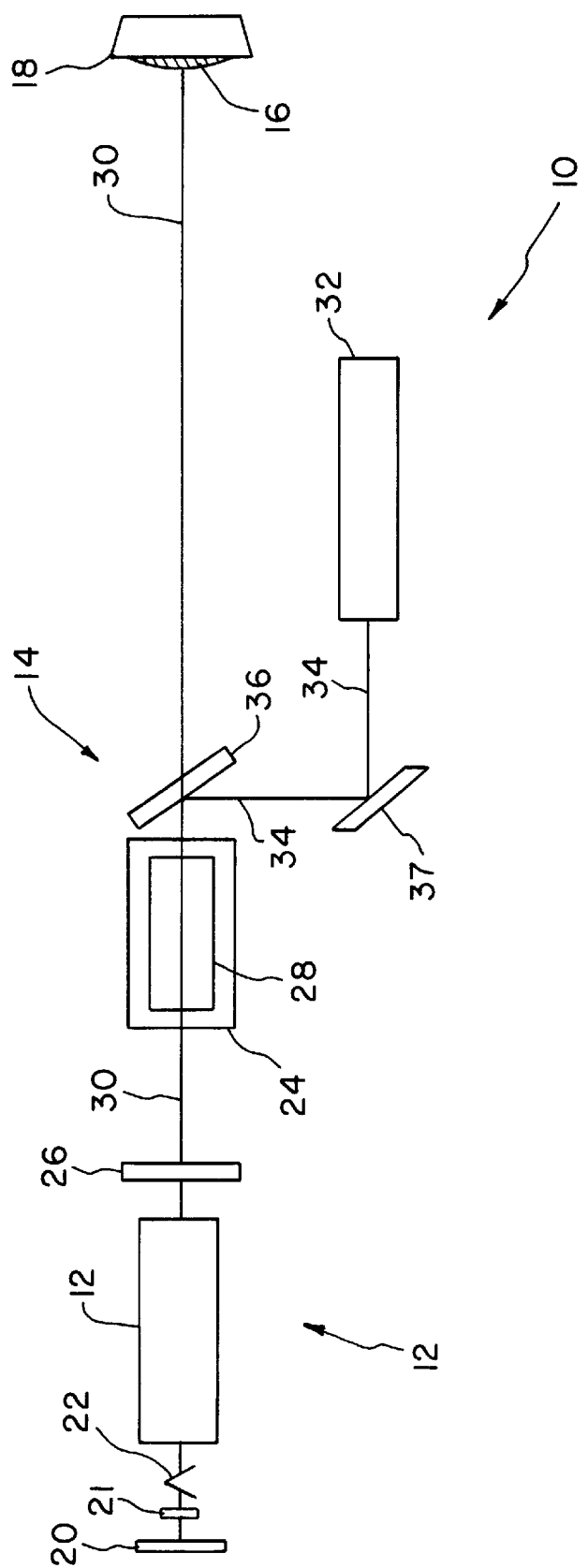
FIG. 2 is a diagrammatic view of a laser system incorporating the present invention.

The present invention reduces the thermal load on the gain medium by controlling the wavelength of photons applied to the gain medium. Referring specifically to FIG. 2, laser 10 is composed of oscillator 12 and amplifier 14. Laser 10 is a pulse-type laser which produces pulses of coherent energy of 50 joules. An energy absorbing overlay 16 is applied to workpiece 18.

During laser shock processing, a beam of coherent energy 30 is directed to the energy absorbing overlay 16. Overlay 16 is vaporized forming a plasma, therein, and producing a shock wave on workpiece 18 which imparts deep compressive residual stresses in workpiece 18.

Oscillator 12 consists of HR mirror 20, Q-switch 21, polarizer 22, and output coupler 26. Amplifier 14 includes pump cavity 24 having gain medium 28 through which laser beam 30 traverses. Gain medium 28 is composed of neodymium in a phosphate glass matrix and can be in the form of either a rod or a slab.

During the operation of the laser 10, a beam of coherent energy, laser beam 30, is generated by oscillator 12. Beam 30 passes through gain medium 28 of pump cavity 24 which couples photons to gain medium 28. These photons are incorporated into laser beam 30.

In one embodiment of the present invention, an alexandrite laser 32 produces a pump beam of photons 34 at a predetermined pump wavelength which minimizes the wavelength difference between the pump wavelength and the transition wavelength of gain medium 28. Consequently, the neodymium atoms of gain medium 28 are excited to the upper laser state. With an alexandrite laser system, the typical photon wavelength is between 700 and 800 nanometers. The gain medium of the alexandrite laser is chromium-doped chrysoberyl.

In one alternate embodiment, the pumping means includes any laser that supplies a pumping wavelength that minimizes the quantum defect. In another alternate embodiment, pumping means includes a flashlamp and filter which selects pump wavelengths which minimize the quantum defect.

Photons from alexandrite laser 32 travel longitudinally, (i.e. coaxial), to the gain medium axis upon which laser beam 30 proceeds. A dichroic mirror 36, which differentiates between various wavelengths, is used to couple the Alexandrite photons into the gain medium. Dichroic mirror is at a 45° angle to laser beam 30. Dichroic mirror 36 is transparent to laser beam 30 but reflective to pump beam 34.

Alexandrite laser beam 34 is directed to reflect off of HR 45° mirror 37 and dichroic mirror 36 and into pump cavity 24. Pump beam 34 has a wavelength substantial equal to the transition wavelength between the upper laser state and the ground state of the neodymium atom. The energy from pump beam 34 is subsequently absorbed by the gain medium 28 and incorporated into laser beam 30.

Longitudinal photon pumping produces a laser beam having an energy spatial profile which mimics that of the spatial profile of the photons used to pump the gain medium. For example, pumping with a beam having a Gaussian spatial energy profile produces a laser beam 30 having a Gaussian spatial energy profile. Similarly, pumping with a photon pump beam having a substantially uniform spatial energy profile will result in a laser beam having a uniform spatial energy profile. Consequently, the spatial energy profile of laser beam 30 is modified by variably controlling the spatial profile of the pump beam 34.

Figure 3:
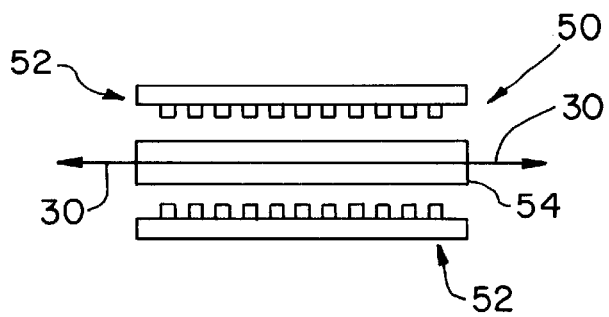
FIG. 3 is a diagrammatic view of a laser amplifier pump cavity of the present invention.

Referring now to FIG. 3, in an alternate embodiment, pump cavity 50 is a diode laser pump system. Diode pump system may consist of any number of materials such as gallium aluminum arsenide, gallium arsenide, gallium arsenide phosphorous, and various other semiconductor materials. A plurality of diodes 52 are operatively associated with pump cavity 50.

Diodes 52 are depicted as being disposed symmetrically about gain medium 54. Alternatively, diodes 52 can be non-symmetrically disposed about gain medium 54. For example, the density of diodes may increase towards the output of the amplifier pump cavity 50. In addition, photon production from the individual or group of diodes can be independently controlled. As a result, various diodes 52 can produce photons to form a specific pattern of operating diodes. An asymmetrical application of photonic energy may be applied to gain medium 54 by controlling the location of diodes 52 along gain medium 54 and by controlling the operation (i.e. firing) of individual or groups of diodes.

Photons from the plurality of diodes 52 are transversely coupled to the gain medium axis. The gain medium axis is the axis upon which laser beam 30 traverses gain medium 54. Alternatively, diode energy can be coupled longitudinally into the gain medium.

According to another feature of the present invention, pump cavity 50 can be used to produce a laser beam having a predetermined spatial energy profile. The individual diodes 52 can be activated to apply photonic energy to gain medium 54 asymmetrically. As a result of asymmetric application of photonic energy, pump cavity 50 can be used to tailor or modify a laser beam's spatial energy profile, as desired.

For example, a substantially uniform spatial energy distribution can be achieved by activating specific diodes 52 to form a predetermined diode operating pattern, which results in a substantially uniform spatial energy distribution (i.e. profile). Alternatively, other predetermined diode operating patterns can be utilized to produce a desired spatial energy profile.

Using current diode technology, approximately 1,000 diodes would be necessary to produce the 100 to 200 joules/cm² necessary to do effective laser shock processing at a 1/2 hertz processing rate.

According to another feature of the present invention, the diode wavelength (i.e., the wavelength of photons produced by diodes 52) may be adjusted. Depending on the transition wavelength of the gain medium, it may be desirable to adjust the diode wavelength to be substantially equal to that transition wavelength. As discussed above, it is advantageous to have the pumping photon wavelength to be substantially equal to the transition wavelength of the gain medium in order to decrease the thermal load on the gain medium 54. The wavelength of photons produced by a diode can be adjusted by temperature tuning.

The use of diodes has an advantage over traditional flashlamp pumping cavities in that the diode life is on the order of $10^9$ laser firing cycles, whereas flashlamp life is approximately $10^6$ to $10^7$ laser firing cycles.

An advantage of reducing the thermal load on the gain medium is an increase in repetition firing rate of a laser. As much as a three-fold firing rate may be realized by pumping at a wavelength substantially equal to the transition wavelength. Consequently, the heat load will be lowered and thermal lensing and birefringence effects reduced.

Figure 4:
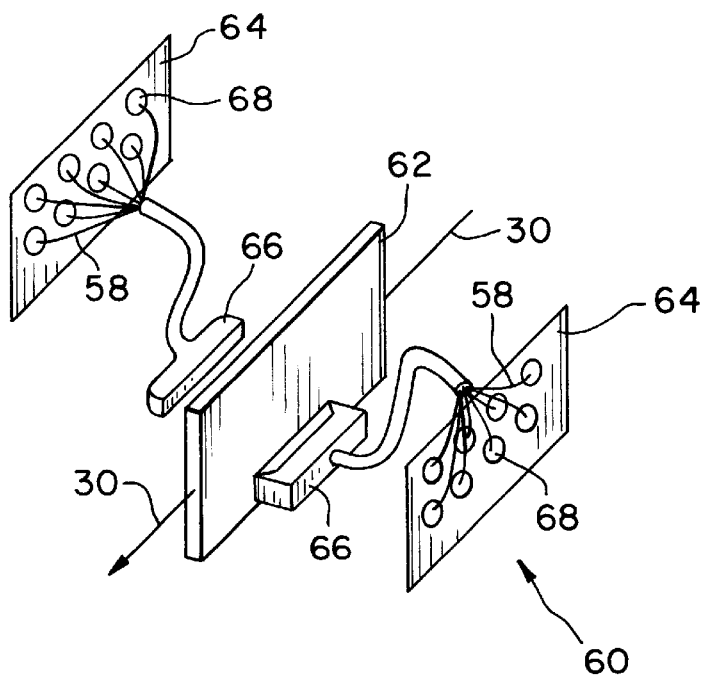
FIG. 4 is a diagrammatic view of an alternate embodiment of a laser amplifier pump cavity using fiber optics for coupling a photon generator to the gain medium.

While FIG. 3 depicts diodes 52 to be disposed along and in close proximity to gain medium 54, diodes 52 may be alternately coupled into the pump cavity. For example, referring to FIG. 4, fiber-coupled diode laser 60 may be used to pump gain medium 62. Fiber optics 58 couple diode laser bank 64 to gain medium 62. Diode laser bank 64 produces photons supplied to gain medium 64 through two fiber modules 66. The firing of individual diodes 68, which comprise diode laser bank 64, are controlled. As a result, diode laser bank 64 controls the location on gain medium 62 where photonic energy is applied. Consequently, diode laser bank 64 can be used to produce a laser beam with a desired spatial energy profile.

While this invention has been described as having a preferred design, the present invention can be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains and which fall within the limits of the appended claims.

What is claimed is:

1. A laser shock processing apparatus for improving properties of a workpiece by providing shock waves therein, comprising:
    an energy absorbing overlay, said overlay applied to the workpiece;
    a laser beam having a spatial energy profile, said beam applied to said overlay;
    an amplifier having a gain medium, said gain medium composed of atoms having a ground energy state, an upper laser state, and higher energy states, said gain medium having a transition state energy difference being the difference in energy between said upper laser state and said ground state, said transition state energy difference corresponding to a transition wavelength, said gain medium having an axis along which said laser beam proceeds; and
    pumping means operatively coupled to said gain medium for supplying photons at a predetermined pump wavelength, said pumping means comprising a diode laser pump, said pumping means forming said laser beam to have a substantial uniform spatial energy profile.

2. The laser shock processing apparatus according to claim 1, wherein said pumping means comprises an alexandrite laser.

3. The laser shock processing apparatus according to claim 1, wherein said pumping means supplies photons upon an axis transverse to said gain medium axis.

4. The laser shock processing apparatus according to claim 1, wherein said pumping means supplies photons upon an axis coaxial to said gain medium axis.

5. The laser shock processing apparatus according to claim 1, wherein said diode laser pump is composed of diodes disposed about said gain medium.

6. The laser shock processing apparatus according to claim 1, wherein said pump means is operatively associated with said gain medium by fiber optic coupling.

7. The laser shock processing apparatus according to claim 1, further comprising:
    at least one diode producing photons having a diode wavelength; and
    means to adjust said diode wavelength to a desired wavelength.

8. The laser shock processing apparatus according to claim 7, wherein said desired wavelength is substantially equal to said transition wavelength.

9. The laser shock processing apparatus according to claim 1, wherein said pump means supplies photons to said gain medium to selectively modify said laser beam spatial energy profile.

10. The laser shock processing apparatus according to claim 9, wherein said pump means supplies photons to said gain medium to produce a Gaussian spatial energy profile.

11. The laser shock processing apparatus according to claim 1, wherein said pump wavelength is substantially equal to said transition wavelength.

12. The laser shock processing apparatus according to claim 1, wherein said difference between said pump wavelength and said transition wavelength is substantially zero.

13. A laser shock processing apparatus for improving properties of a workpiece by providing shock waves therein, comprising:
    an energy absorbing overlay, said overlay applied to the workpiece;
    a laser beam having a spatial energy profile, said beam applied to said overlay;
    an amplifier having gain medium, said gain medium having an axis along which said laser beam proceeds; and
    pumping means operatively coupled to said gain medium for supplying photons at a predetermined pump wavelength and said pump means modifies said laser beam spatial energy profile within said gain medium to a desired spatial energy profile for application to said overlay.

14. The laser shock processing apparatus according to claim 13, wherein said pump means comprises diodes non-symmetrically operatively associated with said gain medium.

15. The laser shock processing apparatus according to claim 13, wherein said pump means is non-symmetrically operatively associated with said gain medium.

16. The laser shock processing apparatus according to claim 13, wherein said pump means supplies photons to said gain medium to produce a substantial uniform spatial energy profile.

17. The laser shock processing apparatus according to claim 13, wherein said pump means supplies photons to said gain medium to produce a Gaussian spatial energy profile.

18. The laser shock processing apparatus according to claim 13, wherein said pump means supplies photons to said gain medium to produce a substantial uniform spatial energy profile.

19. A laser shock processing apparatus for improving properties of a workpiece by providing shock waves therein, comprising:

- an energy absorbing overlay, said overlay applied to the workpiece;
- a laser beam having a spatial energy profile, said beam applied to said overlay;
- an amplifier having a gain medium, said gain medium composed of atoms having a ground energy state and an upper laser state from which stimulated emission takes place; and
- a diode pumping laser having diodes operatively coupled to said gain medium exciting said gain medium atoms from said ground state to said upper laser state, said diodes are selectively fireable so as to supply photons to said gain medium to selectively modify said laser beam spatial energy profile.

20. The laser shock processing apparatus according to claim 5 wherein said diodes are selectively fireable so as to supply photons to said gain medium to selectively modify said laser beam spatial energy profile.

21. A laser shock processing apparatus for improving properties of a workpiece by providing shock waves therein, comprising:

- an energy absorbing overlay, said overlay applied to the workpiece;
- a laser beam having a spatial energy profile, said beam applied to said overlay;
- an amplifier having a gain medium, said gain medium composed of atoms having a ground energy state and an upper laser state from which stimulated emission takes place; and
- an alexandrite pumping laser operatively coupled to said gain medium exciting said gain medium atoms from said ground state to said upper laser state, said laser beam having an uniform spatial energy profile.

22. The laser shock processing apparatus according to claim 21 wherein said alexandrite pump laser supplies photons to said gain medium to selectively modify said laser beam spatial energy profile.

* * * * *